United States Patent

Ashtiani et al.

[11] Patent Number: 6,078,165
[45] Date of Patent: Jun. 20, 2000

[54] MULTIPLEXED MODULAR BATTERY MANAGEMENT SYSTEM FOR LARGE BATTERY PACKS

[75] Inventors: Cyrus N. Ashtiani, Bloomfield Hills, Mich.; Thomas A. Stuart, Toledo, Ohio

[73] Assignee: Chrysler Corporation, Auburn Hills, Mich.

[21] Appl. No.: 09/215,488

[22] Filed: Dec. 18, 1998

[51] Int. Cl.[7] .................................................... H02J 7/00
[52] U.S. Cl. ........................................... 320/116; 320/119
[58] Field of Search ..................................... 320/116, 138, 320/124, 119, DIG. 20, DIG. 15

[56] References Cited

U.S. PATENT DOCUMENTS

| | | | |
|---|---|---|---|
| 4,194,146 | 3/1980 | Patry | 320/136 |
| 5,504,415 | 4/1996 | Podrazhansky et al. | 320/118 |
| 5,610,495 | 3/1997 | Yee et al. | 320/116 |
| 5,760,488 | 6/1998 | Sonntag | 320/104 |
| 5,808,469 | 9/1998 | Kopera | 324/434 |
| 5,824,432 | 10/1998 | Currle | 429/120 |
| 5,831,514 | 11/1998 | Hilpert et al. | 340/309.15 |

*Primary Examiner*—Adolf Deneke Berhane
*Assistant Examiner*—Lawrence Luk

[57] ABSTRACT

An energy management system for monitoring an energy storage device is disclosed. The energy management system includes a plurality of cells forming the energy storage device. Each of the cells includes a line for communicating a voltage signal. A local module is connected to the cells of the energy storage device. The local module has a plurality of inputs for receiving the voltage signals generated by the cells. The local module provides a multiplexed output signal. A processor is provided for receiving the multiplexed output signal from the local module and monitoring the voltage signals produced by the energy storage device.

19 Claims, 4 Drawing Sheets

MULTIPLEXED MODULAR BATTERY MANAGEMENT SYSTEM FOR LARGE BATTERY PACKS

BACKGROUND OF THE INVENTION

1. Technical Field

The present invention generally relates to an energy management system for an energy storage device. More particularly, the present invention is directed to a multiplexed modular battery management system for multi-cell battery packs which may be suitable for electric and hybrid vehicles.

2. Discussion

In order to commercialize electric and hybrid vehicles on a widespread basis, the energy storage devices or batteries which are the most expensive component of the vehicle must operate reliably through the life of the vehicle. To assist in the reliable operation of the battery, a battery energy management system can be utilized.

The commonly used centralized battery energy management systems require the monitoring and controlling of many physical and electrical attributes of the battery, sometimes in as small a battery segment as a single cell. These attributes typically consist of cell voltages, temperatures, state of the charge (SOC), or any derivatives of these attributes, like temperature and voltage variations among the cells. The collection and transmission of this data to a central processor associated with the battery management system for large battery packs involves using a complex network or array of wires and connectors that tend to add cost and complexity to the system.

As an example, consider a centralized battery energy management system for a 48-cell Li-Ion battery pack. To monitor the voltages of all 48 cells, a centralized management system would require 49 lines to the battery pack; consisting of 48 individual battery voltage lines and one battery ground line. Moreover, if the lines have significant length, monitoring and equalization functions controlled by the energy management system cannot share the same lines, and equalization would require another 49 lines since the equalization currents may cause slight voltage drops that corrupt the voltage measurements.

Accordingly, it is desirable to provide a modular battery management system which uses a multiplexed communication system for reducing the number of wiring harness lines within the vehicle. It is also desirable to provide a battery management system in which a plurality of local modules are distributed between the battery pack and a central module. Finally, it is desirable to provide a local module having a simplified and low cost output stage which may be used as an alternative to an isolation amplifier.

SUMMARY OF THE INVENTION

The modular battery management system described here is intended for large battery packs where the individual cell or collection of cell voltages must be monitored and equalized. Other system attributes such as temperature and current measurements can also be incorporated.

In the present invention, many of the management functions are performed by small local modules each serving a subset of the total battery pack. These modules are mounted very close to the subset of batteries they serve. Information gathered by the local modules is then multiplexed on a shared set of lines and sent to a centralized location for processing. This system is intended to minimize size, wiring, and number of connectors, and hence cost, while maintaining reliability and data processing speed of the equivalent centralized system.

BRIEF DESCRIPTION OF THE DRAWINGS

Additional objects, advantages and features of the present invention will become apparent from the following description and appended claims, taken in conjunction with the accompanying drawings in which:

DETAILED DESCRIPTION OF THE PREFERRED EMBODIMENT

Figure 1:
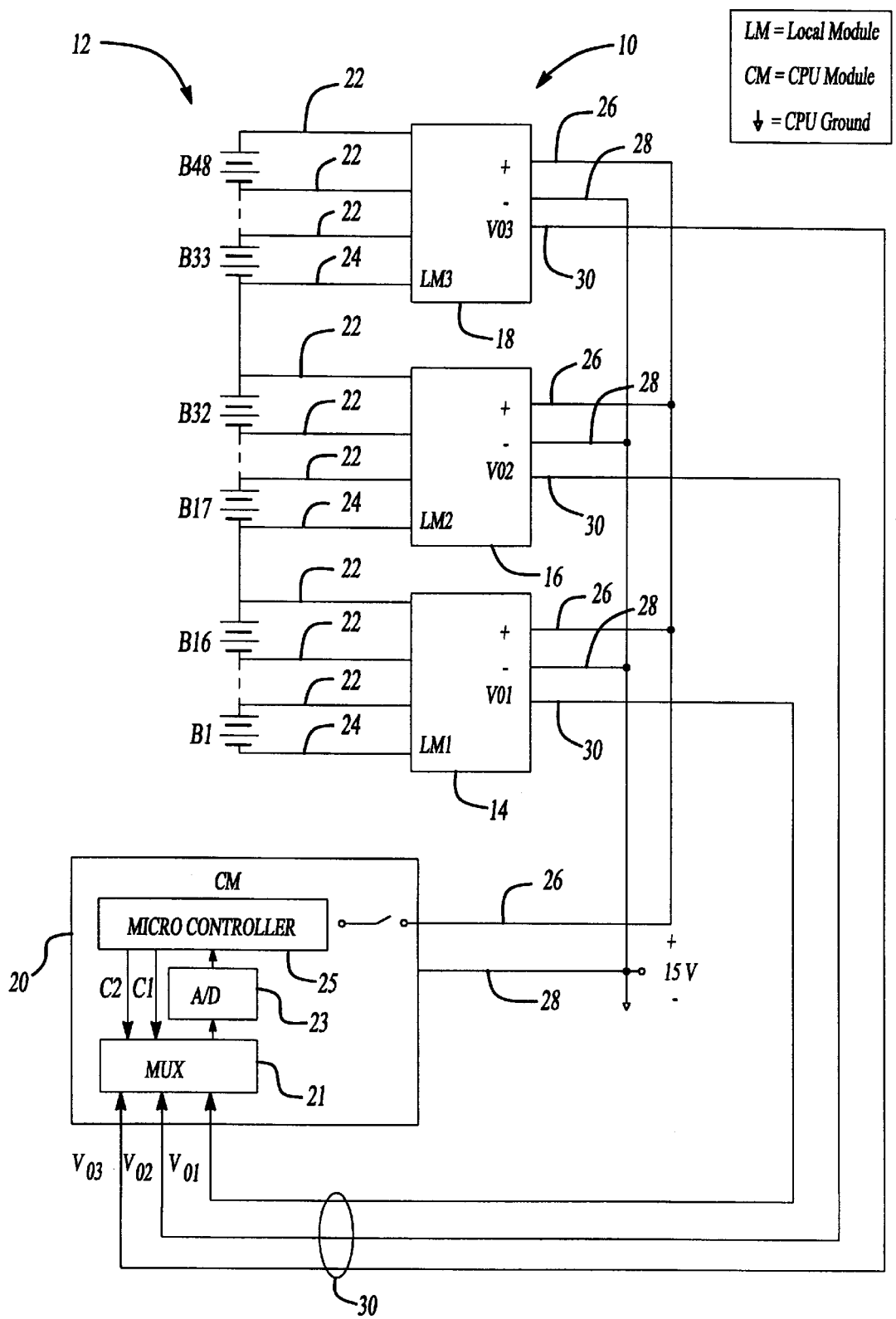
FIG. 1 is a schematic diagram of a modular battery management system for a 48-cell energy storage device in accordance with a preferred embodiment of the present invention.

With reference to FIG. 1, a modular battery management system 10 for monitoring the individual voltages of a 48 cell energy storage device or battery pack 12 is described. The battery cells 12 are grouped together into three blocks of sixteen cells. Each block of sixteen cells are connected to a local module. As shown, battery cells B1–B16 are connected to local module 14, battery cells B17–B32 are connected to local module 16, and battery cells B33–B48 are connected to local module 18. As shown all of the battery cells are connected in series, with a line 22 being connected to the positive terminal of each cell, and a line 24 being connected to the negative terminal of the last cell of each sixteen cell segment. While only three lines 22 are shown between the battery cells and their respective local module, sixteen lines 22, and one line 24 (for a total of seventeen lines) connect between the battery cells for one segment and the local module.

Each local module 14, 16, 18 is connected to a processor based central module 20. A pair of common supply lines 26, 28 connect between the central module 20 and each local module 14, 16, 18, which provide a 15V supply voltage to each of the electronic devices. Each local module 14, 16, 18 has an output line 30 ($V_{O1}$, $V_{O2}$, $V_{O3}$) which communicates the individually multiplexed voltage signals from each battery cell within battery pack 12 back to the central module 30. As part of this embodiment of the invention, supply line 28 forms a common data ground for the local modules 14, 16, 18 and central module 20.

As part of the battery management system 10, the local modules 14, 16, 18 are located in close proximity to the battery pack 12 so that lines 22, 24 can be very short, or may be integrally formed within the structure of the battery pack 12. Additionally, when local modules 14, 16, 18 are used as shown in FIG. 1, only three wires are required between each local module 14, 16, 18 and the central module 20. This is because the +15V supply lines 26 and its respective data ground lines 28 are shared by all local modules 14, 16,18 and there is only one distinct data line 30 ($V_{O1}$, $V_{O2}$ and $V_{O3}$ in this example) per local module 14,16,18 which carries the multiplexed data or voltage signal of their respective subset of battery cells. Thus, the design of modular battery management system 10 significantly reduces the number of wires within the wiring harness extending between the battery pack and the central module.

Figure 3:
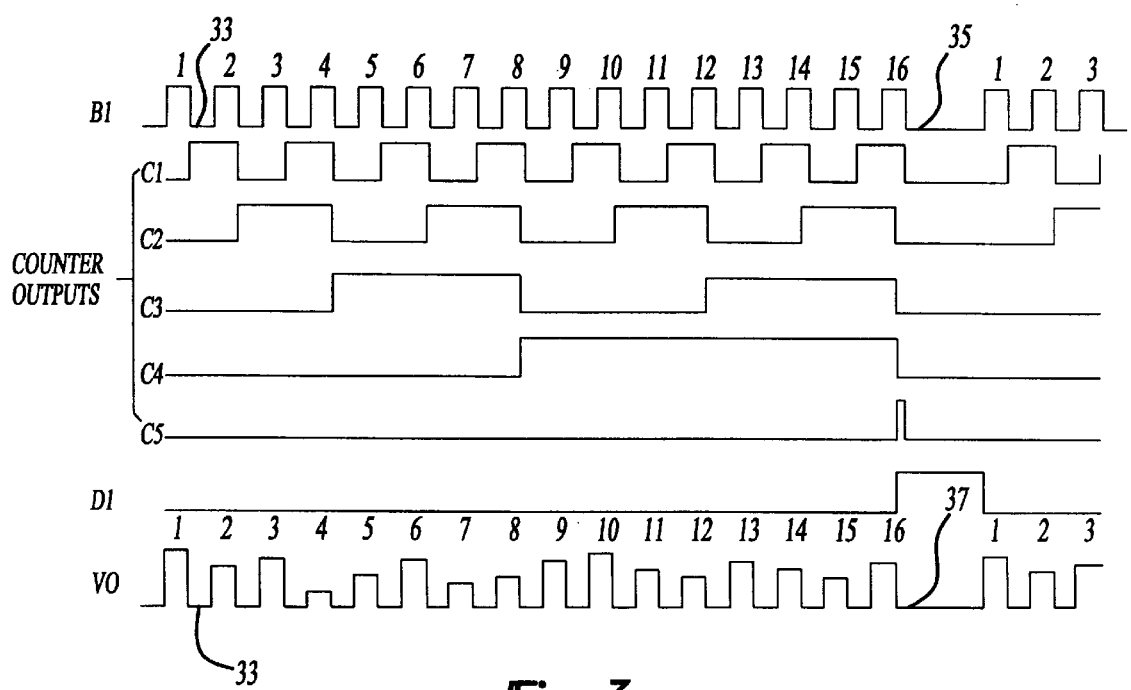
FIG. 3 is a signal timing diagram for the logic signals generated by the circuit of FIG. 2.

Since there is only one multiplexed output $V_O$ 30 per local module, all respective module voltages are sent sequentially from this output 30 as shown in the bottom of FIG. 3. In this pulse train, each of the sixteen pulse amplitudes is an analog voltage proportional to one of the sixteen cell voltages in the battery segment. A zero voltage pulse signal 33 is generated between the subsequent pulse trains to signal the end of one voltage signal and start of a new voltage signal.

Figure 2:
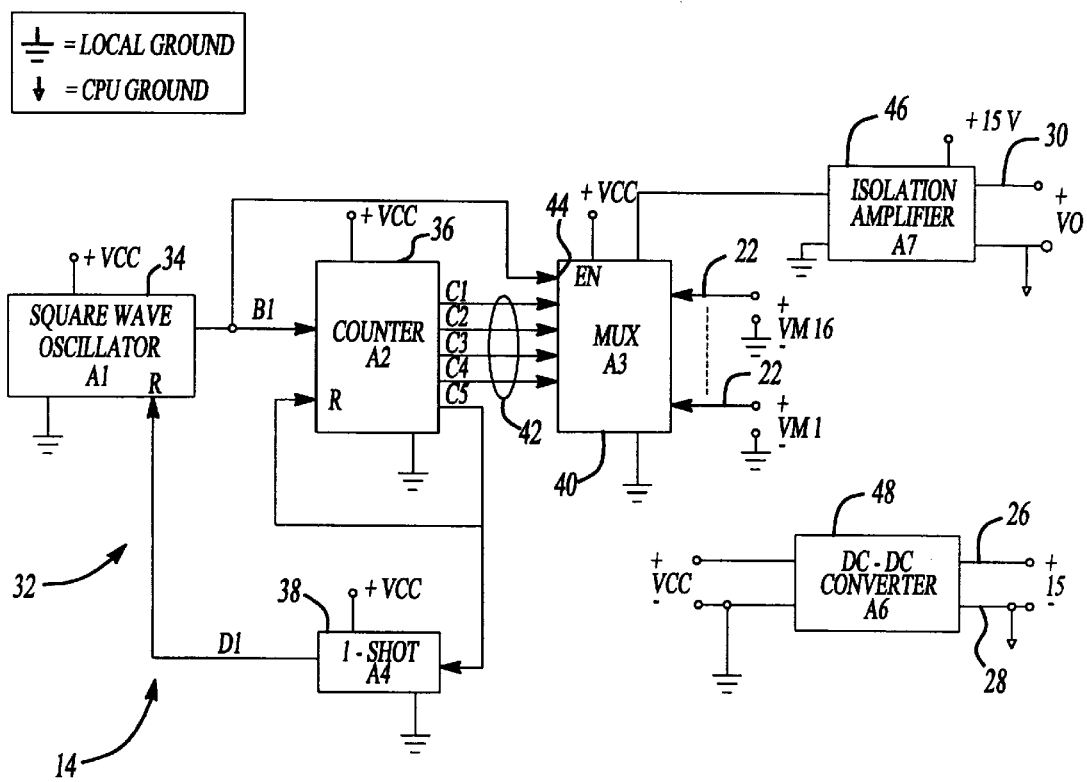
FIG. 2 is a schematic diagram of the logic circuitry for each local module for the circuit of FIG. 1 which further includes an isolation amplifier.

Referring now to FIG. 2, the logic circuit associated with each local module 14, 16, 18 is shown. The sequential analog voltage pulses from each battery cell within battery pack 12 is generated by the local module circuit 14 of FIG. 2. The local module circuit 14 includes a counter circuit 32 which comprises a square wave oscillator 34, a 1–16 counter 36 and a one-shot 38. The square wave oscillator 34 produces a square wave $B_1$ (FIG. 3) which drives the counter 36. The counter 36 in turn generates a digital count that continuously counts from 1 to 16 via a 4-digit binary output 42 ($C_1C_2C_3C_4$).

The digital counting signal from output 42 of counter 36, along with the square wave timing signal $B_1$ from the square wave oscillator 34 drives the enable port 44 of a multiplexer (MUX) 40 which routes each of the sixteen battery voltage signals 22, $V_{m1}$–$V_{m16}$, to the output 30, $V_O$. Each of these sixteen battery voltage signals 22, $V_{m1}$–$V_{m16}$, may optionally be pre-processed by a resistive divider circuit (not shown) that references all sixteen signals to the data or CPU ground 28. Whenever the count reaches sixteen, the counter output $C_5$ resets the counter 36 and activates the one-shot 38 which in turn disables square wave oscillator 34 for three (3) half cycles, generating the long zero signal 35 (FIG. 3). The MUX enable signal $B_1$ disables the MUX output $V_O$ during each part of the $B_1$ cycle where the square wave oscillator 34 output is zero.

The isolation amplifier 46 and the DC-DC converter 48 provide the necessary galvanic isolation between the batteries 12 and the central module 20. The DC-DC converter 48 within the local module 14 receives the 15V DC supply voltage from line 26, and produces the regulated source voltage $V_{CC}$ for each of the logic chips within the local module 14 and the logic circuit of the central module 20.

Referring to FIG. 1, a three input MUX 21 in the central module 20 routes the signals from the local modules 14, 16, 18 to the A/D converter 23. The MUX 21 is sequenced by the control lines C1 and C2 from the microcontroller 25. The microcontroller 25 within the central module 20 then records all 48 battery voltages and provides the necessary communication with any other equipment which uses this information.

With reference to FIG. 3, the A/D converter 23 within the central module 20 is programmed to be ready to read and sample a new cell voltage pulse whenever it detects a zero voltage 33 between two pulses. Thus, the central module 20 reads seventeen (17) voltage pulses on each scan, and the microcontroller 25 can identify the "long zero" space 37 between pulses 16 and 1. This ensures that the central module 20 reads and samples a complete set of voltage pulses, and that the central module 20 identifies the first voltage pulse by using the location of the long zero 37.

Battery voltage equalization can be provided by locating a separate ramp equalizer (not specifically shown) within each of the local modules 14, 16,18. If the local module is sufficiently close to the batteries it serves, the voltage monitor and equalizer can share the same lines to the batteries. The equalizer can be activated when a +15V supply is applied to the local module. Alternatively, it can be activated by a separate control line from the central module 20.

Although the modular battery management system of FIGS. 1–3 provides several advantages over previous centralized methods, the isolation amplifier 46 within the local module 14 is a relatively large and expensive item, which in turn increases the cost of the modular battery management system 10. As part of an alternate preferred embodiment of the present invention, these isolation amplifiers 46 are replaced by a simplified output stage circuit at the cost of connecting a common data ground (described in greater detail below) between the central module and the local modules.

Figure 4:
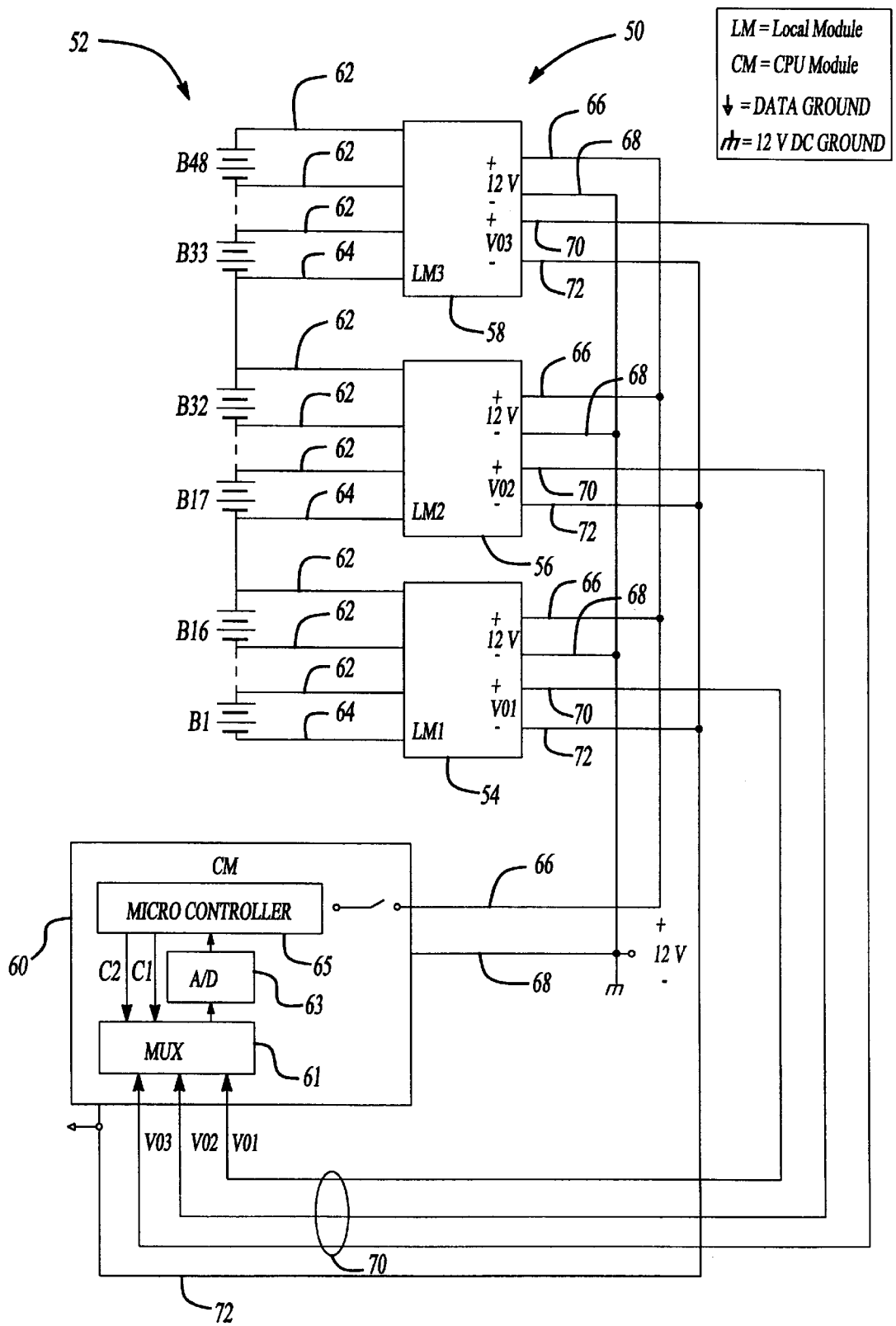
FIG. 4 is a schematic diagram of a modular battery management system for a 48-cell energy storage device in accordance with an alternate preferred embodiment of the present invention.

Turning now to FIG. 4, a schematic diagram of the modular battery management system 50 in accordance with an alternate preferred embodiment of the present invention is shown. The battery management system 50 of the present invention is also intended for monitoring the individual voltages of a forty-eight (48) cell energy storage device or battery pack 52. The battery cells of battery pack 52 are grouped together into three segments or blocks of sixteen cells each. Each block of sixteen cells is connected to a local module 54, 56, 58. As shown, battery cells B1–B16 are connected to local module 54, battery cells B17–B32 are connected to local module 56, and battery cells B33–B48 are connected to local module 58. All of the battery cells are connected in series, with a line 62 being connected to the positive terminal of each cell, and a line 64 being connected to the negative terminal of the last cell of each battery cell segment. While only three lines 62 are shown between the battery cells and their respective local module, a total of sixteen lines 62 are used per battery segment; one for each battery cell.

Each local module 54, 56, 58 is connected to a processor based central module 60. A common supply lines 66, and a common ground line 68 connect between the central module 60 and each local module 54, 56, 58, which provides a 12V supply voltage to each of the devices. Each local module 54, 56, 58 has an output line 70 ($V_{O1}$, $V_{O2}$, $V_{O3}$) which provides the individually multiplexed voltage signals from each battery cell within battery pack 52 to the central module 60. As shown, a fourth common data ground line 72 is connected between each local module 54, 56, 58 and the central module 60. While data ground line 72 adds a fourth line to the wiring harness, its cost is significantly outweighed by the elimination of the isolation amplifier 46, which is described in greater detail below.

Referring to FIG. 4, a three input MUX 61 in the central module 60 also routes the signals from the local modules 54, 56, 58 to the A/D converter 63. The MUX 61 is sequenced by the control lines C1 and C2 from the microcontroller 65. The microcontroller 65 within the central module 60 then records all 48 battery voltages and provides the necessary communication with any other equipment which uses this information.

With reference to FIG. 3, the A/D converter 63 within the central module 60 is programmed to be ready to read and sample a new cell voltage pulse whenever it detects a zero voltage between two pulses. Thus, the central module 60 reads seventeen (17) voltage pulses on each scan, and the microcontroller 65 can identify the "long zero" space 37 between pulses 16 and 1. This ensures that the central module 60 reads and samples a complete set of voltage pulses, and that the central module 60 identifies the first voltage pulse by using the location of the long zero 37.

Figure 5:
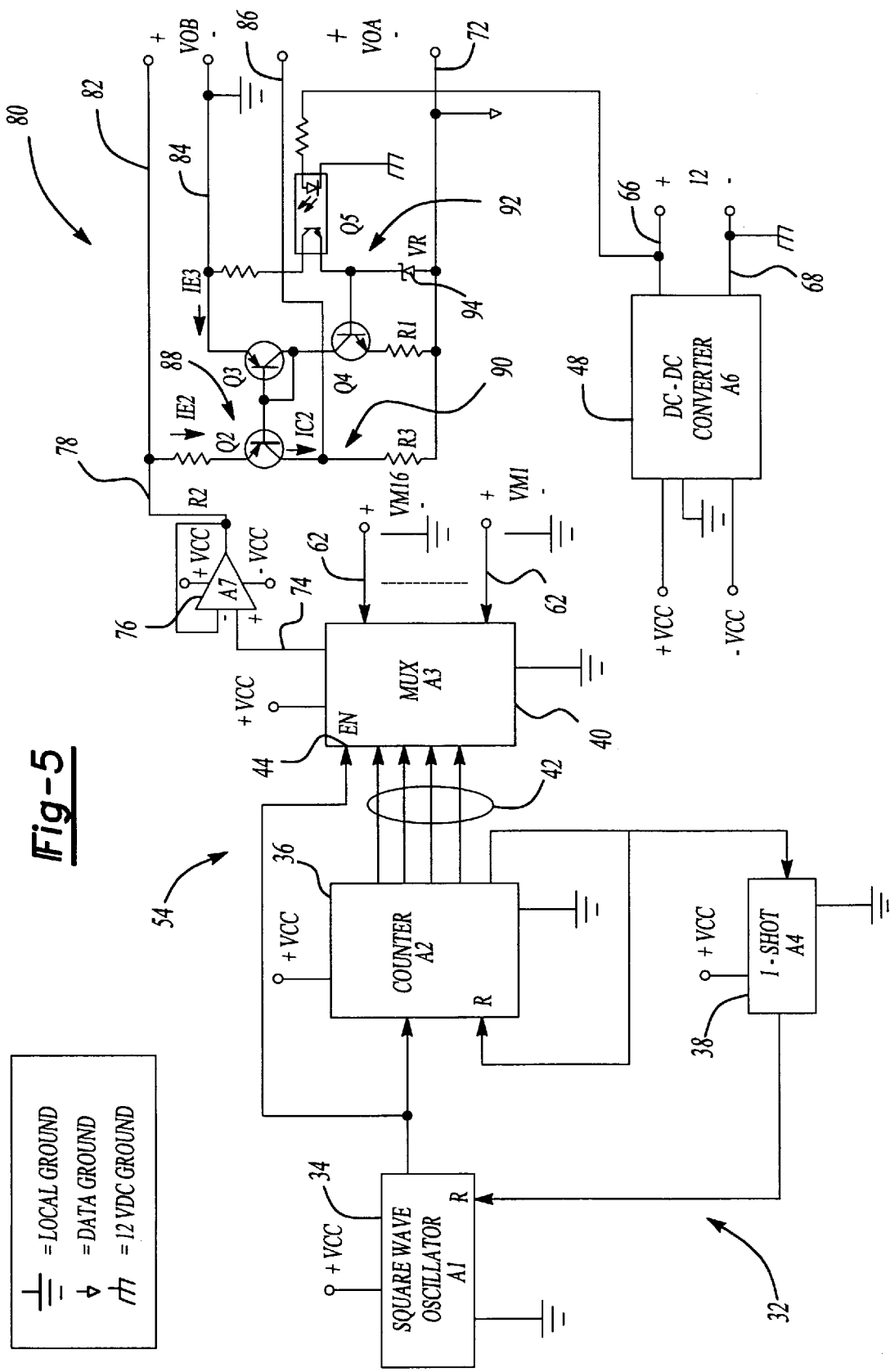
FIG. 5 is a schematic diagram for the logic circuitry of each local module for the circuit of FIG. 4 which includes the output stage in accordance with the teachings of the present invention.

The logic circuit shown in FIG. 5 is substantially similar to the circuit shown in FIG. 3 except for the output stage 80 and the two separate grounds, namely the 12V supply voltage ground line 68 and the data ground 72. The output stage 80 also provides each local module 54, 56, 58 with two separate voltage outputs. The appropriate voltage output is selected depending upon which position the local module occupies within the battery management system 50. In view of the similarities, it should be assumed that the counter circuit 32 associated with local module 54 operates in a substantially similar fashion as the counter circuit associated with local module 14. Thus, MUX 40 operates to communicate the voltage signals from the cells of battery pack 52 to the MUX output 74 at predetermined time intervals, as controlled by counter circuit 32.

The MUX output 74 is provided to a voltage follower 76 which operates as a buffer between the MUX 40 and the output stage 80 of the present invention. The output 78 of the voltage follower 76 provides the buffered battery voltage signal to the output stage 80. The voltage follower 76 is provided to prevent the output stage 80 from loading and corrupting the individual voltage signals communicated from the cells of the battery pack 52.

With continued reference to FIG. 5, the output stage 80 of the present invention is disclosed. The output stage 80 includes a pnp transistor Q2 connected between the $V_{OB}$ output terminal 82 and the $V_{OA}$ output terminal 86. A biasing resistor R2 is disposed between the $V_{OB}$ output terminal 82 and the emitter of Q2. A pnp transistor Q3 has its emitter connected to the negative $V_{OB}$ output terminal 84 (also serving as local ground), and its base connected to the base of Q2. As shown, transistor Q3 is a diode connected transistor, which is used to cancel the emitter-base voltage of Q2. These components form a transconductance amplifier 88.

A resistor R3 is connected between the collector of transistor Q2 and the data ground 72. The combination of resistors R2 and R3 forms a resistive voltage divider circuit 90. The current through the voltage divider 90 is controlled by the voltage $V_{OB}$ and Q2, and the transconductance amplifier 88 is switched on and off by a switching circuit 92.

The switching circuit 92 is formed by an npn transistor Q4 having its collector connected to the collector of transistor Q3, and its emitter connected to the data ground 72 via a biasing resistor R1. The base of transistor Q4 is connected to the emitter of an opto-isolator transistor Q5, and connected to the cathode of a zener diode 94 having its anode connected to the data ground 72. As shown, the data ground 72 also forms the negative $V_{OA}$ output terminal.

In operation, the transistor Q5 is turned on when power is applied to the DC-DC converter 48. The transistor Q5 then turns on transistor Q4 which controls the flow of current $I_{E3}$ through transistor Q3. Thus, when transistor Q4 is switched on, resistor R1 and zener diode 94 hold the current $I_{E3}$ constant.

If $V_{EB2}$=emitter to base voltage of Q2,
$V_{EB3}$=emitter to base voltage of Q3,
and $I_{E3}=I_{E2}$,
$V_{EB3}$ will cancel $V_{EB2}$ so that $$I_{E2} = \frac{V_{OB}}{R_2}.$$

Furthermore, $I_{E2}=I_{C2}+I_{B2}$, and if the gain of Q2 is sufficiently large, $I_{C2} \gg I_{B2}$.

When the above holds true so that $I_{C2}=I_{E2}$, and if $R_2=R_3$, $V_{OA}=V_{OB}$.

Therefore, $V_{OA}$ will be equal to the multiplexed MUX output 74.

The output stage 80 of the present invention provides two separate outputs, only one of which is selected for use, depending upon the location of the local module within the battery management system 50. More particularly, when the first local module 54 (associated with the lowest potential segment of the battery pack 12) is connected to the data ground 72, then the local ground 84 is equal in potential to the data ground 72 (i.e. no current $I_{E3}$ will flow through transistor Q3), and the $V_{OB}$ output 82 of the output stage 80 is selected for connection to line output 70 since the $V_{OA}$ output 86 will always be equal to zero (0) volts. However, when additional local modules 56, 58 (connected to the higher potential cells within the battery stack) are used, the local ground 84 is at a much higher voltage potential than the data ground 72, and the $V_{OA}$ output 86 of the output stage 80 is selected for connection to the output line 70.

The foregoing discussion discloses and describes exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. An energy management system for monitoring an energy storage device comprising:
    a plurality of cells forming the energy storage device, each of the cells having a line for communicating a voltage signal;
    a local module connected to the cells of the energy storage device, the local module having a plurality of inputs for receiving the voltage signals generated by the cells, and the local module having an output stage for providing a multiplexed output signal; and
    a processor for receiving the multiplexed output signal from the local module and monitoring the voltage signals produced by the energy storage device.

2. The energy management system of claim 1 wherein the local module includes a counter circuit for driving a multiplexer.

3. The energy management system of claim 1 wherein the local module includes an isolation amplifier.

4. The energy management system of claim 1 wherein the output stage includes a first output and a second output.

5. The energy management system of claim 1 wherein the output stage includes a voltage divider circuit for operating on the voltage signals produced by the energy storage device.

6. The energy management system of claim 5 wherein the voltage divider circuit is a resistive voltage divider circuit.

7. The energy management system of claim 5 wherein the current flowing through the voltage divider circuit is regulated by a transconductance amplifier circuit.

8. The energy management system of claim 7 wherein the transconductance amplifier circuit is operated by a switching circuit.

9. A modular energy management system for monitoring a battery system comprising:

a plurality of cells forming the battery system;

a local module connected to the plurality of cells, the local module including a multiplexing circuit for generating a multiplexed output, the multiplexed output producing a series of voltage signals associated with the cells;

a control module for processing the voltage signals received from the local module; and an output stage disposed between the multiplexing circuit and the control module, the output stage including a voltage divider circuit operative for providing galvanic isolation between the plurality of cells and the processor.

10. The modular energy management system of claim 9 wherein the output stage is an isolation amplifier.

11. The modular energy management system of claim 9 wherein the local module generates N voltage signals, and wherein N is equal to the number of cells connected to the local module.

12. The modular energy management system of claim 9 wherein the local module generates a zero voltage pulse between each voltage signal in the series of voltage signals.

13. The modular energy management system of claim 9 wherein an extended zero voltage pulse is generated between the last voltage signal of a first series of voltage signals and the first voltage signal of a second series of voltage signals.

14. A modular battery management system for monitoring a battery system comprising:

a plurality of cells forming the battery system;

a plurality of local modules, each of the local modules connected to a series of cells within the battery system, each of the local modules including a multiplexing circuit for generating a multiplexed output, the multiplexed output producing a series of voltage signals associated with the cells;

a control module for receiving the voltage signals from each of the local modules;

an output stage disposed between the multiplexing circuit and the control module, the output stage including a first output for receiving the voltage signals directly from an output of the multiplexing circuit, and a second output for receiving the voltage signals from a voltage divider circuit connected to the output of the multiplexing circuit;

the first output being connected to the control module when the local module is connected to the lowest potential series of cells within the battery system, and the second output being connected to the control module when the local module is connected to the series of cells other than the lowest potential series of cells within the battery system.

15. The modular battery management system of claim 14 wherein the voltage divider circuit is a resistive voltage divider circuit.

16. The modular battery management system of claim 14 wherein the voltage divider circuit includes a transconductance amplifier for regulating current flowing through the voltage divider circuit.

17. The modular battery management system of claim 16 wherein the transconductance amplifier is controlled by a switching circuit.

18. The modular battery management system of claim 14 wherein the control module includes an A/D converter for sampling the voltage signals.

19. The modular battery management system of claim 14 wherein the control module includes a multiplexer for receiving the series of voltage signals from the plurality of local modules connected to the battery system.

* * * * *

UNITED STATES PATENT AND TRADEMARK OFFICE
CERTIFICATE OF CORRECTION

PATENT NO. : 6,078,165
DATED : June 20, 2000
INVENTOR(S) : Cyrus N. Ashtiani and Thomas A. Stuart It is certified that error appears in the above-identified patent and that said Letters Patent is hereby corrected as shown below:

<u>Column 1,</u>
After the Title, please insert the following new heading and paragraph:

-- STATEMENT REGARDING FEDERALLY SPONSORED RESEARCH OR DEVELOPMENT

This invention was made with Government support under NREL subcontract number ZAN-6-16334-01, prime contract number DE-AC36-83CH10093 issued by the Department of Energy. The government has certain rights in this invention." --

Signed and Sealed this

Twenty-second Day of January, 2002

*Attest:*

JAMES E. ROGAN
*Attesting Officer*  *Director of the United States Patent and Trademark Office*